United States Patent
Fourney

(12) 
(10) Patent No.: US 10,800,044 B2
(45) Date of Patent: Oct. 13, 2020

(54) SINGULATION OF CONVEYED PRODUCTS USING ELECTROADHESION

(71) Applicant: Laitram, L.L.C., Harahan, LA (US)

(72) Inventor: Matthew L. Fourney, Laurel, MD (US)

(73) Assignee: Laitram, L.L.C., Harahan, LA (US)

( * ) Notice: Subject to any disclaimer, the term of this patent is extended or adjusted under 35 U.S.C. 154(b) by 282 days.

(21) Appl. No.: 16/108,833

(22) Filed: Aug. 22, 2018

(65) Prior Publication Data

US 2019/0061172 A1  Feb. 28, 2019

Related U.S. Application Data

(60) Provisional application No. 62/550,749, filed on Aug. 28, 2017.

(51) Int. Cl.

| | |
|---|---|
| *B25J 15/00* | (2006.01) |
| *B65G 43/02* | (2006.01) |
| *B65G 47/92* | (2006.01) |
| *B65G 17/08* | (2006.01) |
| *B65G 17/40* | (2006.01) |
| *B65G 17/46* | (2006.01) |
| *H01L 21/683* | (2006.01) |

(52) U.S. Cl.
CPC ....... *B25J 15/0085* (2013.01); *B25J 15/0009* (2013.01); *B65G 17/08* (2013.01); *B65G 17/40* (2013.01); *B65G 17/46* (2013.01); *B65G 43/02* (2013.01); *B65G 47/92* (2013.01); *B65G 2207/30* (2013.01); *H01L 21/6833* (2013.01)

(58) Field of Classification Search
CPC ... B25J 15/0085; B25J 15/0009; B65G 43/02; B65G 17/08; B65G 17/40; B65G 17/46; B65G 47/92; B65G 2207/30; H01L 21/6833; H01L 21/67103
See application file for complete search history.

(56) References Cited

U.S. PATENT DOCUMENTS

| | | | | |
|---|---|---|---|---|
| 4,830,461 | A | * | 5/1989 | Ishiharada .............. B29C 48/05 385/13 |
| 5,774,153 | A | * | 6/1998 | Kuehnle ................ B41F 21/005 347/129 |
| 8,861,171 | B2 | | 10/2014 | Prahlad et al. |

(Continued)

FOREIGN PATENT DOCUMENTS

| | | |
|---|---|---|
| WO | 2012071198 A2 | 5/2012 |
| WO | 2013166329 A2 | 7/2013 |

(Continued)

OTHER PUBLICATIONS

Extended European Search Report of European Patent Application No. 18187850.5, dated Jan. 16, 2019, European Patent Office, Munich, Germany.

*Primary Examiner* — Yusef A Ahmed
(74) *Attorney, Agent, or Firm* — Catherine M. Bishop

(57) ABSTRACT

A conveyor employs electrostatic force to selectively adhere packages to an inclined conveying surface and selectively release packages from the inclined conveying surface to separate the packages from each other. A pair of electrodes embedded in the body of a conveyor belt module are selectively energized via electrically conductive hinge rods used to connect conveyor belt modules together to generate the electrostatic force.

5 Claims, 1 Drawing Sheet

(56) References Cited

U.S. PATENT DOCUMENTS

| | | | |
|---|---|---|---|
| 9,093,926 B2 | 7/2015 | Prahlad et al. | |
| 9,776,796 B2* | 10/2017 | Tanz | B65G 15/24 |
| 9,987,755 B2 | 6/2018 | Prahlad et al. | |
| 10,191,001 B2* | 1/2019 | Kleczewski | G01N 27/228 |
| 2003/0085107 A1* | 5/2003 | Sedlacek | B65G 17/06 |
| | | | 198/853 |
| 2004/0211653 A1* | 10/2004 | Aisenbrey | B29C 45/0013 |
| | | | 198/866 |
| 2009/0194391 A1* | 8/2009 | Lagneaux | B65G 43/02 |
| | | | 198/810.04 |
| 2013/0221761 A1* | 8/2013 | DePaso | B29C 45/1679 |
| | | | 307/151 |
| 2013/0237000 A1* | 9/2013 | Tabe | B32B 17/10018 |
| | | | 438/57 |
| 2013/0242455 A1* | 9/2013 | Prahlad | B25J 15/00 |
| | | | 361/234 |
| 2013/0292303 A1* | 11/2013 | Prahlad | B03C 7/02 |
| | | | 209/129 |
| 2013/0294875 A1* | 11/2013 | Prahlad | B65G 17/46 |
| | | | 414/730 |
| 2014/0144756 A1* | 5/2014 | DePaso | H05F 3/00 |
| | | | 198/804 |
| 2014/0216894 A1* | 8/2014 | Fourney | B65G 43/08 |
| | | | 198/340 |
| 2016/0221758 A1* | 8/2016 | Bogle | B65G 17/46 |
| 2017/0038244 A1* | 2/2017 | Kleczewski | G01G 19/035 |
| 2017/0087728 A1* | 3/2017 | Prahlad | B65G 13/075 |
| 2017/0144839 A1* | 5/2017 | Bogle | B65G 17/40 |
| 2017/0155171 A1* | 6/2017 | Kirchev | H01M 4/16 |
| 2018/0354726 A1* | 12/2018 | Kleczewski | G01L 1/146 |
| 2020/0182712 A1* | 6/2020 | Kleczewski | B65G 43/08 |

FOREIGN PATENT DOCUMENTS

| | | |
|---|---|---|
| WO | 2015094375 A1 | 6/2015 |
| WO | 2015142754 A1 | 9/2015 |

* cited by examiner

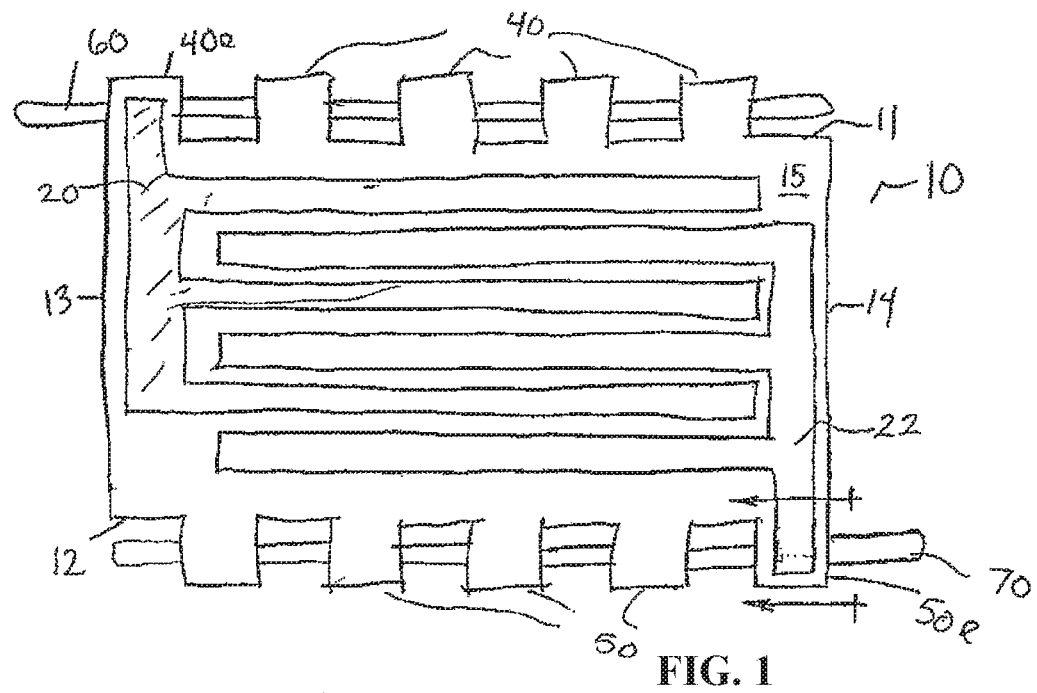
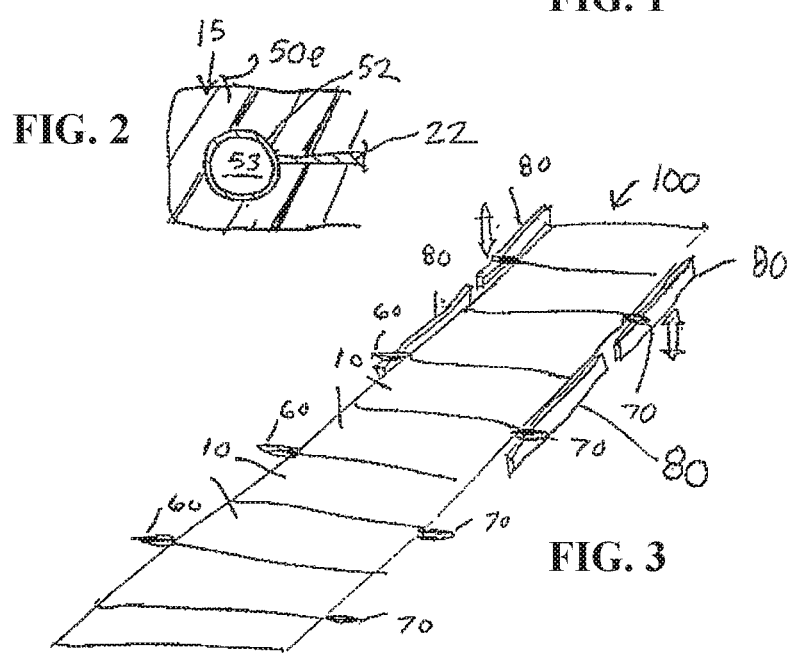
FIG. 1
FIG. 2
FIG. 3

SINGULATION OF CONVEYED PRODUCTS USING ELECTROADHESION

RELATING APPLICATIONS

This application claims priority to U.S. Provisional Patent Application No. 62/550,749, filed Aug. 28, 2017 and entitled "Singulation of Conveyed Products Using Electroadhesion", the contents of which are herein included by reference.

BACKGROUND

In the postal and parcel industry it is common to convey parcels in mass flow, in which products are both beside one another and on top of one another. As a result, there is a need for technology to singulate the parcels. Often, one of the first steps to singulating the flow is creating a single layer of product. Technologies exist today that eliminate products beside each other but only after a step that eliminates products on top of each other.

A current approach to eliminating products on top of each other employs a steep inclined conveyor with varying friction surfaces. On a steep enough incline and a conveyor belt with a high friction surface, packages slide backwards off of each other but not off of the belt. A limitation to this concept if that often when inclining the conveyor to the angle required to get packages to slip off of each other, tall packages will tumble backwards. If a package is tall enough to tumble, it will likely stay there in perpetuity tumbling endlessly and never make it up the incline.

One way to enable a very steep inclined but still not have a package tumble backwards is to get the product to adhere to the belt in some way. One simple way to do that is via a vacuum system which exists today but has limitations in both energy, noise, wear and maintenance.

SUMMARY OF THE INVENTION

A conveyor employs electrostatic force to selectively adhere packages to an inclined conveying surface and selectively release packages from the inclined conveying surface to separate the packages from each other. A pair of electrodes embedded in the body of a conveyor belt module are selectively energized via electrically conductive hinge rods used to connect conveyor belt modules together to generate the electrostatic force.

According to one aspect, a module for a conveyor comprises a module body extending longitudinally from a first end to a second end, laterally from a first side to a second side and in height from a top surface to an opposite bottom surface, a pair of electrodes embedded in the module body and spaced from each other, a first set of hinge elements extending from the first end of the module body, a first hinge element including a first bushing connected to a first electrode and a first electrically conductive hinge rod inserted through the first set of hinge elements and connecting to the first electrode via the first bushing. The module body comprises a dielectric material.

According to another aspect, a conveyor comprises a frame forming an inclined carryway, a conveyor belt extending up the inclined carryway, the conveyor belt comprising a plurality of hingedly connected conveyor belt modules, at least one conveyor belt module comprising an embedded capacitor. An electrically conductive hinge rod is inserted in a hinge passageway to connect at least two conveyor belt modules together. The electrically conductive hinge rod is in electrical contact with the embedded capacitor. A plurality of pick-up shoes are adjacent to a side of the conveyor belt. The hinge rod contacts a pick-up shoe to selectively energize the embedded capacitor to generate an electroadhesive force.

According to another aspect, a method of separating articles on a conveyor belt, comprising the steps of conveying the articles up an inline on a conveyor belt, selectively generating an electroadhesive force on an article by energizing a capacitor embedded in the conveyor belt below the article via an electrically conductive hinge rod connected to the capacitor and extending from a side edge of the conveyor belt and selectively stopping the electroadhesive force to allow the article to slide down the incline.

BRIEF DESCRIPTION OF THE DRAWINGS

FIG. 1 is a top view of a conveyor belt module including an embedded capacitor according to an embodiment of the invention;

FIG. 2 is a detailed view of a hinge element of the conveyor belt module of FIG. 1;

FIG. 3 is an isometric view of a conveyor belt comprising a plurality of conveyor belt modules with embedded capacitors.

DETAILED DESCRIPTION

A conveyor employs electrostatic force to help selectively adhere packages to the conveyor. The conveyor comprises a plurality of hingedly connected modular plastic conveyor belt modules capable of generating an electrostatic force. The electrostatic force may be turned on to generate an adhesive force on the package and turned off to allow the packages to slide down an inclined conveying surface.

FIG. 1 shows a conveyor belt module 10 that embeds a capacitor within the body of the conveyor belt module. The body of the conveyor belt module 10 extends longitudinally from a first end 11 to a second end 12, laterally from a first side 13 to a second side 14 and in height from a top conveying surface 15 to an opposite bottom surface (not shown).

The capacitor is formed by two electrodes 20, 22 embedded in the body of the conveyor belt module and separated by a dielectric comprising injection-molded plastic forming the majority of the conveyor belt module. The illustrative electrodes 20, 22 are shaped like combs with interdigitating, parallel fingers, but the invention is not so limited and the electrodes can have any suitable pattern or configuration. When energized, the capacitor generates an electrostatic adhesion force on a package on the top conveying surface 15.

Each module 10 includes a first set of hinge elements 40 extending from the first end 11 of the module body and a second set of hinge elements 50 extending from the second end 12 of the module body. The hinge elements 40, 50 include hinge openings aligned along an axis to form a hinge passageway.

Electrically conductive hinge rods 60, 70 are inserted through the hinge openings in the hinge elements 40, 50 and used to hingedly connect adjacent modules in a conveyor belt as well as selectively charge the capacitor. The first hinge rod 60 extends beyond the first side 13 of the module and end hinge element 40e. The second hinge rod 70 extend past the second side 15 of the module and end hinge element 50e.

The hinge rods form contacts that can connect to a power source. When connected to the power source, the voltage applied to the electrodes 20, 22 via the hinge rods generates static electricity, which provides an adhesive force for products conveyed on the top surface 15. The adhesive force can help prevent tall packages from tumbling but still let other products slide off of it.

Referring to FIG. 2, an end hinge element 50e include a bushing 52 surrounding the hinge opening 53 to connect a hinge rod inserted therein to an associated electrode 22. End hinge element 40e also includes a bushing to connect the hinge rod 60 to the associated electrode 20.

Referring to FIG. 3, a plurality of conveyor belt modules with embedded capacitors, such as the module 10 of FIGS. 1 and 2, can be connected together using hinge rods 60, 70 to form a conveyor belt 100. The illustrative conveyor belt 100 is inclined on a carryway of a conveyor frame that forms an incline. The hinge rods 60, 70 alternatively extend beyond the side edges of the conveyor belt to contact a power supply.

The conveyor belt can create multiple zones across both the length and width of the conveyor belt that can be individually controlled by powering each zone using the hinge rods 60, 70 in order to singulate conveyed packages. For example, the hinge rods 60 can be positively charged, while the hinge rods 70 can be negatively charged (or vice versa). Pick-up shoes 80 are provided adjacent to the conveyor belt side edges for powering the embedded capacitor. The pick-up shoes 80 can be raised and lowered or otherwise moved to place the shoes into and out of contact with the hinge rods, selectively connecting and disconnecting the electrodes to a power supply. When energized via the pick-up shoes and hinge rods, the embedded capacitors generate an electroadhesive force on conveyed packages to retain the packages on the conveying surface of the conveyor belt. The electroadhesive force can be stopped to allow packages to slide down the incline of the conveyor belt, thereby destacking the packages, by moving the pick-up shoes out of contact with the hinge rods, or stopping the power supply to the pick-up shoes.

In another embodiment, both the positive and negative hinge rods 60, 70 can extend from the same side of the belt, but have different geometries or other features to pick up power uniquely.

In one embodiment, the conveyor belt modules 10 can have smart relays to allow for the individual control of the capacitors in the modules. One could communicate to the modules either wirelessly or via communication over the power network.

In another embodiment, a vision system may be used to sense large dumps of packages on an inclined conveyor belt and turn the electroadhesive forces on and off via an algorithm to manage the flow of packages on the inline.

A controller is used to selectively generate electroadhesive forces in various zones on the conveyor belt to help separate packages conveyed on the conveyor belt from each other.

In another embodiment, the conveyor may have fixed zones of electroadhesion that are always on, but the zones are staggered across the width of the belt and along the length to minimize product density and products on top of each other.

The invention has been described relative to certain illustrative embodiments, but is not limited to these embodiments.

What is claimed is:

1. A module for a conveyor belt, comprising:
    a module body extending longitudinally from a first end to a second end, laterally from a first side to a second side and in height from a top surface to an opposite bottom surface, the module body formed mainly of a dielectric material;
    a pair of electrodes embedded in the module body and spaced from each other;
    a first set of hinge elements extending from the first end of the module body, a first hinge element including a first bushing connected to a first electrode;
    a first electrically conductive hinge rod inserted through the first set of hinge elements and connecting to the first electrode via the first bushing, wherein the first electrically conductive hinge rod extends beyond the first side of the module body;
    a second set of hinge elements extending from the second end of the module body, a second hinge element including a second bushing connected to a second electrode; and
    a second electrically conductive hinge rod inserted through the second set of hinge elements and connecting to the second electrode via the second bushing, wherein the second electrically conductive hinge rod extends beyond the second side of the module body.

2. The module of claim 1, wherein the pair of electrodes comprises interdigitating, parallel fingers.

3. A conveyor comprising:
    a frame forming an inclined carryway;
    a conveyor belt extending up the inclined carryway, the conveyor belt comprising a plurality of hingedly connected conveyor belt modules, at least one conveyor belt module comprising an embedded capacitor;
    a plurality of electrically conductive hinge rods inserted in hinge passageways to connect at least two or more of the plurality of hingedly connected conveyor belt modules together, each electrically conductive hinge rod in electrical contact with a respective embedded capacitor, wherein a positive hinge rod extends from a first side of the conveyor belt and a negative hinge rod extends from a second side of the conveyor belt; and
    a plurality of pick-up shoes adjacent to a side of the conveyor belt, wherein one of the plurality of electrically conductive hinge rods contacts a pick-up shoe to selectively energize the respective embedded capacitor to generate an electroadhesive force.

4. The conveyor of claim 3, wherein the pick-up shoes are moveable into and out of contact with the plurality of electrically conductive hinge rods.

5. A method of separating articles on a conveyor belt, comprising the steps of:
    conveying the articles up an incline on the conveyor belt, wherein the conveyor belt comprises a plurality of hingedly connected modules, each module comprising a pair of electrodes forming a capacitor and a plurality of hinge elements having hinge openings for connecting the plurality of hingedly connected modules together via a plurality of electrically conductive hinge rods, each electrode electrically connected to an electrically conductive hinge rod via a bushing in a hinge opening;
    selectively generating an electroadhesive force on a selected article by contacting a pick-up shoe adjacent a side edge of the conveyor belt and connected to a power supply, with one of the plurality of electrically conductive hinge rods connected to a respective capacitor and extending from the side edge of the conveyor belt to energize the respective capacitor embedded in the conveyor belt below the article; and selectively stopping the electroadhesive force to allow the selected article to slide down the incline.

\* \* \* \* \*